United States Patent
Wang et al.

(10) Patent No.: US 8,629,043 B2
(45) Date of Patent: Jan. 14, 2014

(54) METHODS FOR DE-BONDING CARRIERS

(75) Inventors: Chung Yu Wang, Hsin-Chu (TW);
Jui-Pin Hung, Hsin-Chu (TW);
Chih-Hao Chen, Hsin-Chu (TW);
Chun-Hsing Su, New Taipei (TW);
Yi-Chao Mao, Zhongli (TW);
Kung-Chen Yeh, Taichung (TW);
Yi-Lin Tsai, Tainan (TW); Ying-Tz Hung, Guishan Township (TW);
Chin-Fu Kao, Taipei (TW); Shih-Yi Syu, Daxi Township (TW); Chin-Chuan Chang, Zhudong Township (TW);
Hsien-Wen Liu, Hsin-Chu (TW); Long Hua Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 44 days.

(21) Appl. No.: 13/298,014

(22) Filed: Nov. 16, 2011

(65) Prior Publication Data
US 2013/0122689 A1    May 16, 2013

(51) Int. Cl.
*H01L 21/78*    (2006.01)

(52) U.S. Cl.
USPC ............ 438/464; 257/E21.499; 257/E21.599; 438/106; 438/107; 438/108; 438/109; 438/110; 438/127; 438/466

(58) Field of Classification Search
USPC ........... 257/E21.499, E21.599; 438/106, 107, 438/108, 109, 110, 127, 466, 464
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,582,983 B1 * | 6/2003 | Runyon et al. ................. 438/33 |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |

(Continued)

*Primary Examiner* — Peniel M Gumedzoe
(74) *Attorney, Agent, or Firm* — Slater & Matsil, L.L.P.

(57) ABSTRACT

A method includes performing a dicing on a composite wafer including a plurality of dies, wherein the composite wafer is bonded on a carrier when the step of dicing is performed. After the step of dicing, the composite wafer is mounted onto a tape. The carrier is then de-bonded from the composite wafer and the first tape.

19 Claims, 9 Drawing Sheets

(56) References Cited

U.S. PATENT DOCUMENTS

| | | |
|---|---|---|
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2005/0194670 A1* | 9/2005 | Kameyama et al. .......... 257/678 |
| 2010/0244284 A1* | 9/2010 | Yang et al. .................... 257/787 |

* cited by examiner

METHODS FOR DE-BONDING CARRIERS

BACKGROUND

In the manufacturing of integrated circuits, wafers are involved, and are used for forming integrated circuits or for bonding dies thereon. The wafers are often too thin to endure the force applied in the manufacturing processes such as grinding. Accordingly, during the manufacturing processes, carriers are used to mechanically support the wafers in order to prevent breakage. At certain manufacturing stage, the carriers need to be de-bonded from the wafers. After the de-bonding of the carriers, there may be some remaining processes (such as grinding) that need to be performed on the wafers. Without the support of the carriers, however, the wafers may subject to warpage, and hence the subsequent process steps such as grinding may experience difficulty.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A packaging process is provided in accordance with various embodiments. The intermediate stages of forming packages are illustrated. The variations of the embodiments are discussed. Throughout the various views and illustrative embodiments, like reference numbers are used to designate like elements.

Figure 1:
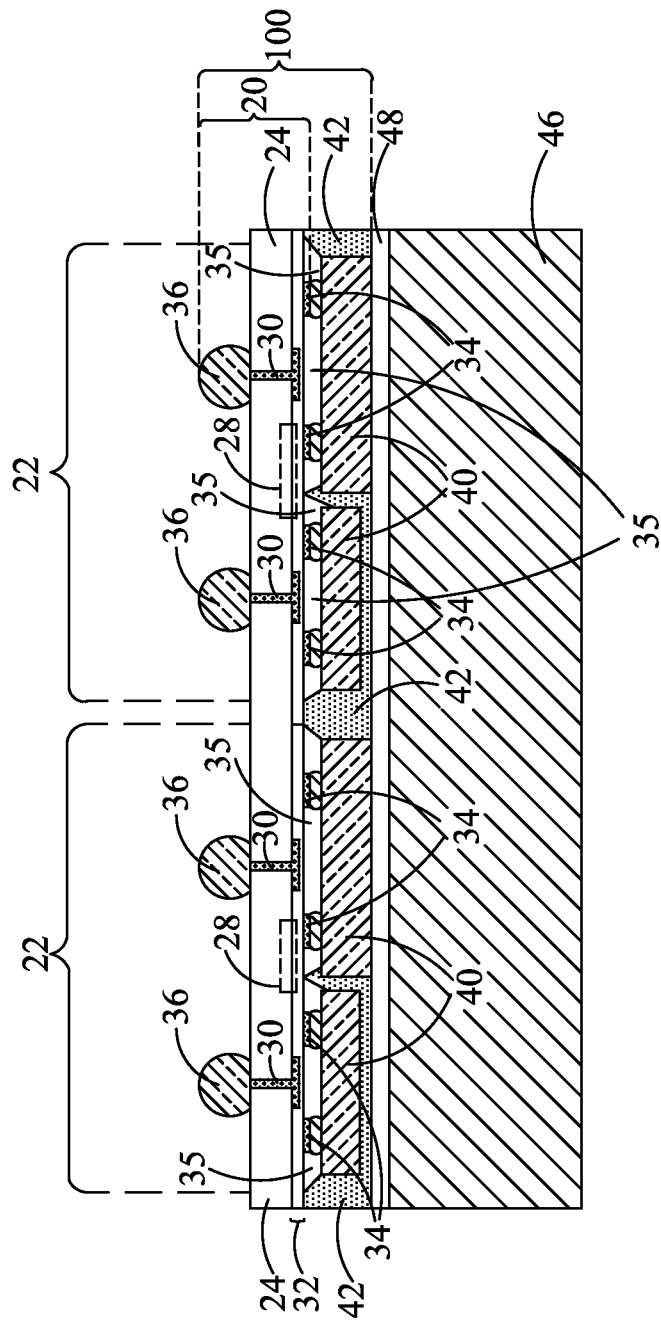
FIGS. 1 through 9 are cross-sectional views of intermediate stages in the manufacturing of a package in accordance with various embodiments.

FIGS. 1 through 9 illustrate cross-sectional views of intermediate stages in the manufacturing of a package in accordance with some exemplary embodiments. Referring to FIG. 1, wafer 20 is provided. Wafer 20 may include a plurality of tiles (also referred to as chips or dies) 22, which may be identical to each other. Wafer 20 may also include substrate 24, which may be a semiconductor substrate or a dielectric substrate. In some embodiments, substrate 24 is a silicon substrate, although it may also be formed of other semiconductor materials such as silicon carbon, silicon germanium, III-V compound semiconductor, or the like. In an exemplary embodiment, wafer 20 is a device wafer, which may include integrated circuits 28 having active devices such as transistors (not shown) therein. Integrated circuits 28 are illustrated using dashed lines to indicate that they may, or may not, be formed. In subsequent drawings, integrated circuits 28 are not shown, although they may exist. In alternative embodiments, wafer 20 may comprise other package components that do not include active devices therein. For example, wafer 20 may be an interposer wafer, a package substrate strip, a package substrate wafer, or the like. In yet other embodiments, wafer 20 does not include active devices, but may include passive devices (also illustrated as 28) such as resistors and capacitors, or free from passive devices.

In some embodiments, wafer 20 includes through-substrate vias (also referred to as through-silicon vias or through-vias) 30 that extend from one side to the opposite side of substrate 24. Wafer 20 may also include metal layers 32 (sometimes referred to as redistribution layers) that include metal lines and vias (not shown) therein. Connectors 34 are formed on a side of wafer 20, and may be electrically coupled to integrated circuits 28 and/or connectors 36 through metal layers 32 and through-vias 30. Connectors 34 and 36 are formed on opposite surfaces of wafer 20, and may comprise solder balls, solder bumps, metal pillars combined with solder caps thereon, and the like. In some exemplar embodiments, connectors 36 are solder balls. Although not shown, redistribution layers may also be formed on the same side of substrate 24 as connectors 36.

Package components 40 are bonded to tiles 22 of wafer 20 through connectors 34. Package components 40 may be device dies including active circuits (such as transistors, not shown) therein, or may be packages including device dies bonded to interposers/package substrates. Although each of tiles 22 is illustrated as having two package components 40 bonded thereon, in alternative embodiments, a single package component or more than two package components may be bonded to each tile 22. Underfill 35 is filled into the space between package components 40 and tiles 22. Polymer 42 is molded on wafer 20, with package components 40 being molded in polymer 42. In some embodiments, polymer 42 comprises a molding compound, a Molding Underfill (MUF), or the like. Polymer 42 is filled in to the gaps between package components 40. Throughout the description, wafer 20, package components 40, and polymer 42 are in combination referred to as composite wafer 100.

Composite wafer 100 is bonded to carrier 46, for example, through bonding layer 48, which may be an adhesive layer formed of an organic material, for example. Carrier 46 may mechanically support wafer 20 during the formation of connectors 36 and the redistribution layers (if any) that are on the same side of substrate 24 as connectors 36. In some embodiments, carrier 46 is a glass carrier.

Figure 2:
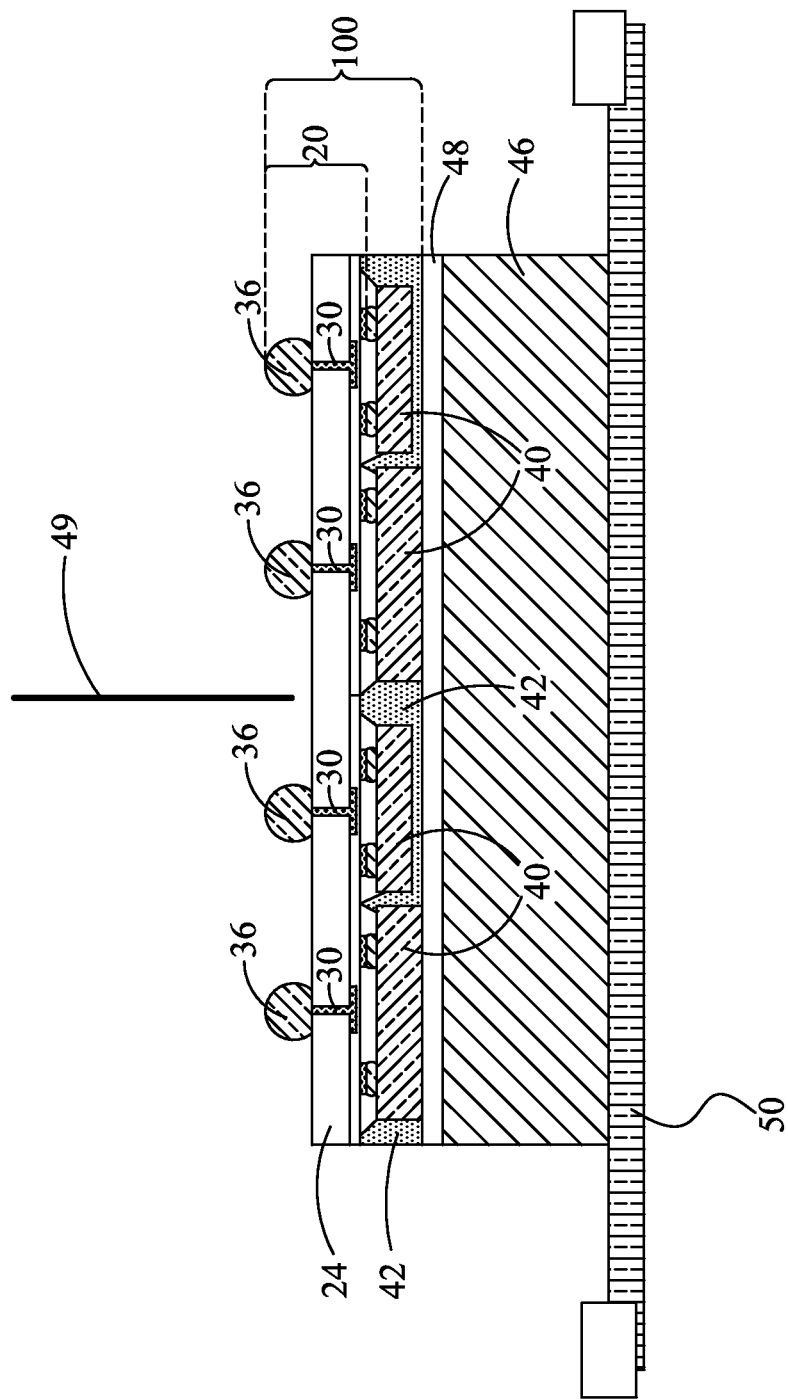
Figure 3:
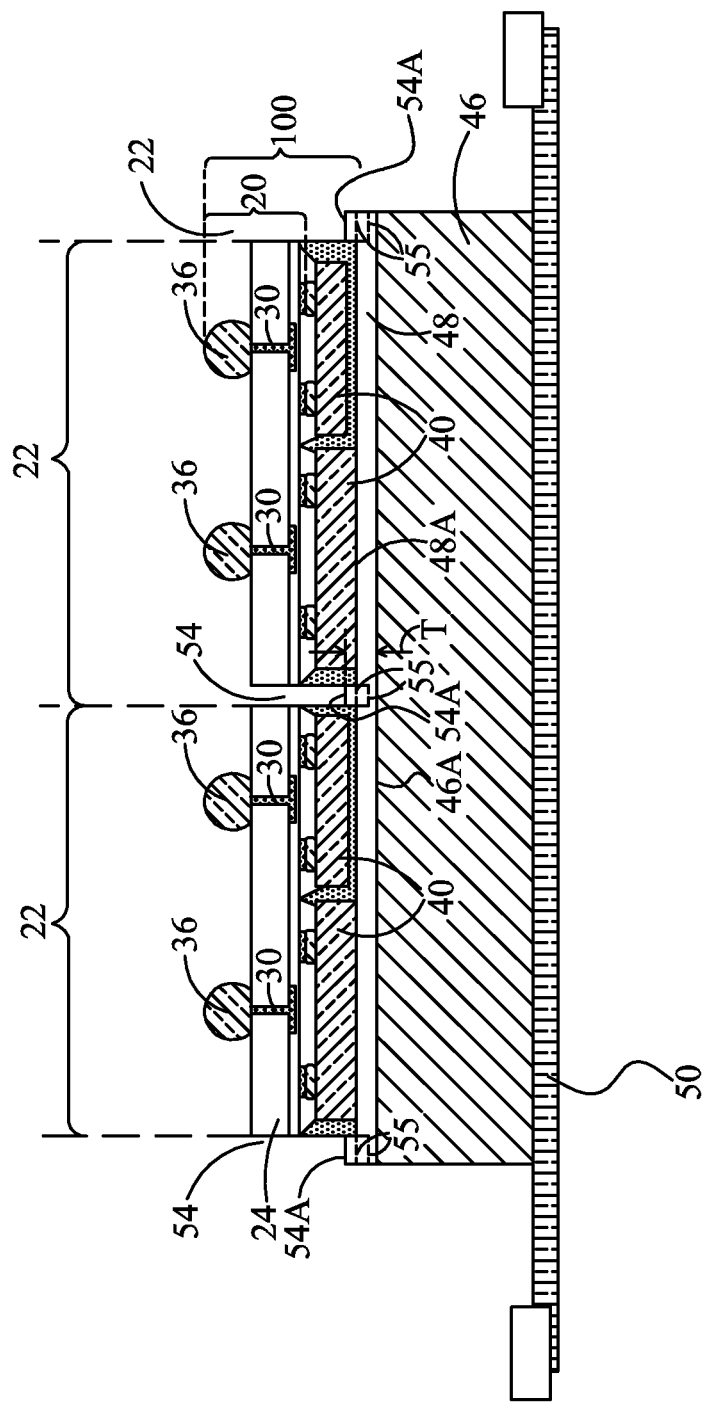

Referring to FIG. 2, carrier 46 along with the overlying composite wafer 100 is mounted onto dicing tape 50. A die-sawing step is performed, for example, using blade 49, to form trenches 54, as shown in FIG. 3. Trenches 54 may extend into the scribe lines of wafer 20. Trenches 54 are deep enough to extend below the bottom surface of wafer 20, so that tiles 22 in wafer 20 are separated from each other. Trenches 54 also extend into polymer 42, and extend into the space between package components 40. In some embodiments, the distance T between bottoms 54A of trenches 54 and top surface 46A of carrier 46 may be between about 10 μm and about 30 μm, so that a margin is maintained and carrier 46 is not undesirably sawed. Accordingly, between bottoms 54A of trenches 54 and top surface 46A of carrier 46, at least a bottom layer, and possibly and entirety, of bonding layer 48 is not sawed. In addition, a bottom layer of polymer 42 may not be sawed. In some embodiments, trenches 54 extend into polymer 42 and do not extend into bonding layer 48. In alternative embodiments, as shown by dashed lines, bottoms 54A of trenches 54 are substantially level with the top surface 48A of bonding layer 48. In yet other embodiments, as also shown by dashed lines, trenches 54 extend into bonding layer 48.

Figure 4:
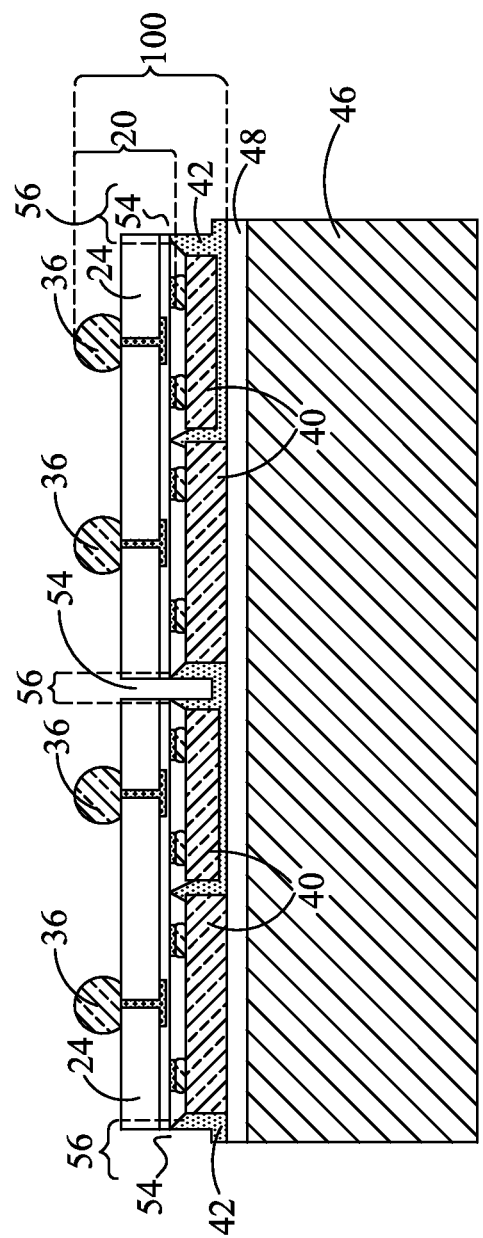
Figure 5:
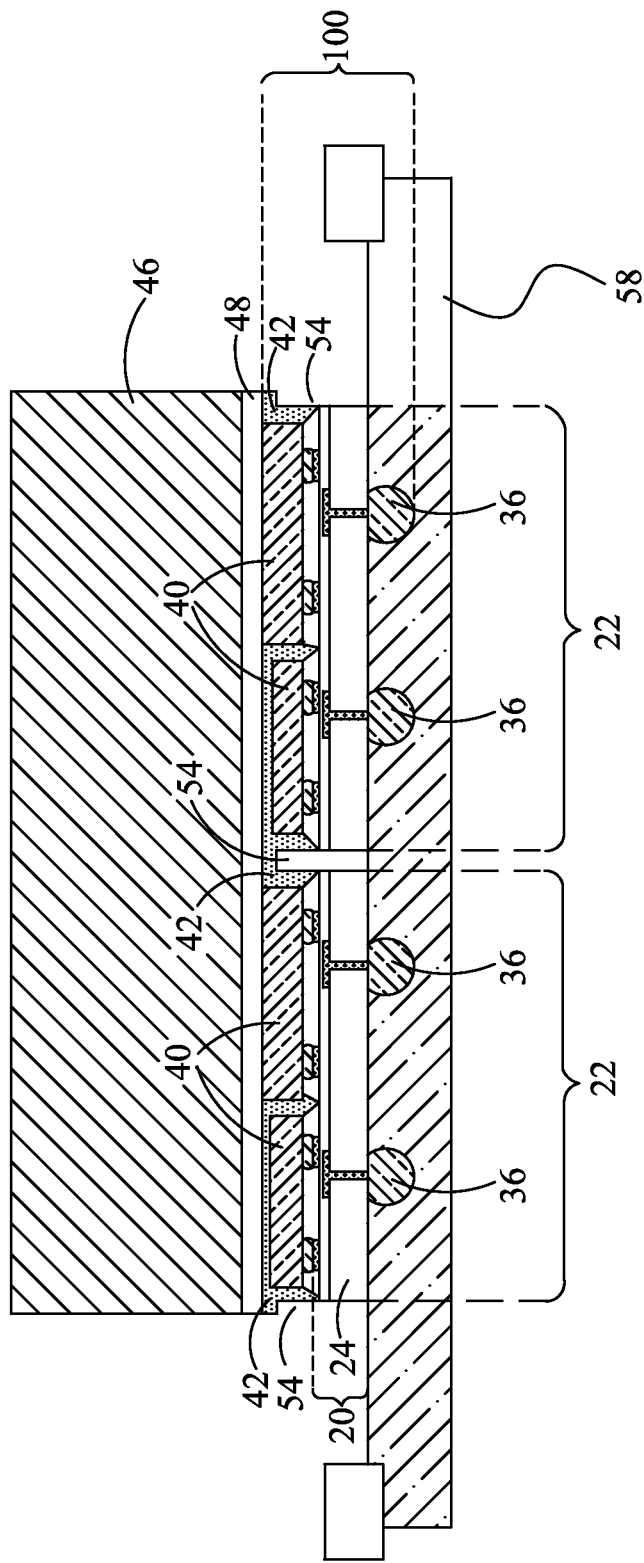

Referring to FIG. 4, carrier 46 and the overlying composite wafer 100 are de-taped from deicing tape 50. Next, as shown in FIG. 5, composite wafer 100 is taped to tape 58. Tape 58 may be thick enough so that connectors 36 may be pressed into, and protected by, tape 58. Tape 58 has enough strength, so that it may hold composite wafer 100, which i substantially separated from each other. In some embodiments, tape 58 is a ultra-violet (UV) tape.

Figure 6:
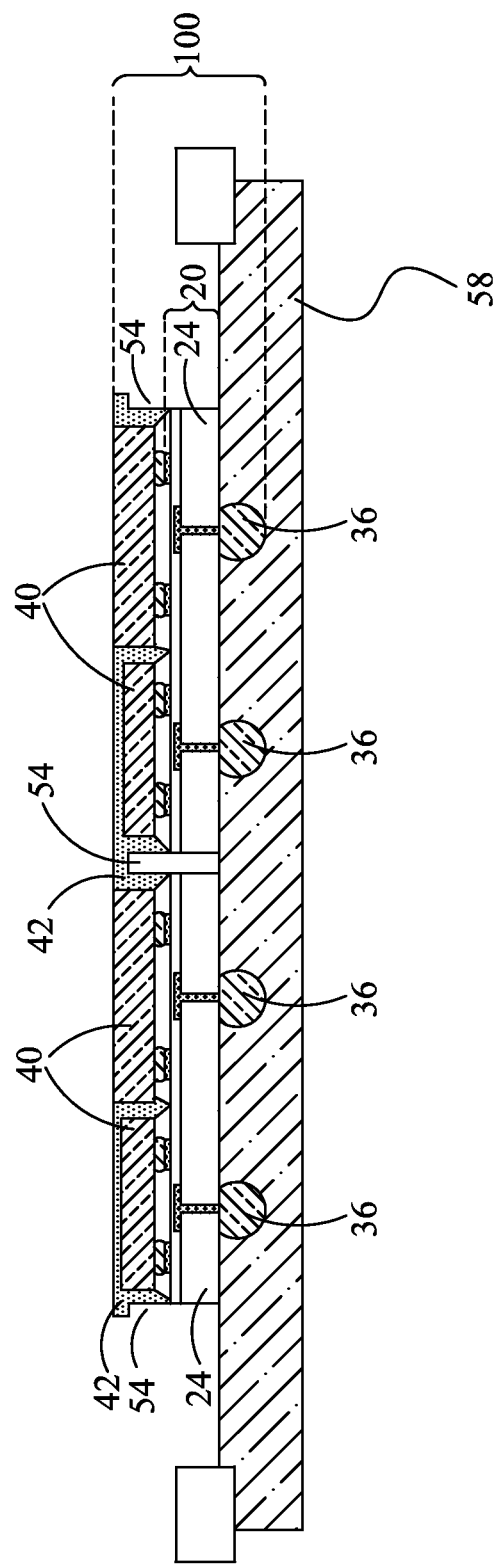

FIG. 6 illustrates the de-bonding of carrier 46. The de-bonding may be performed through laser-lift off, for example, wherein a laser is projected on bonding layer 48 by penetrating through carrier 46. Accordingly, bonding layer 48 is decomposed, and carrier 46 is removed.

Figure 7:
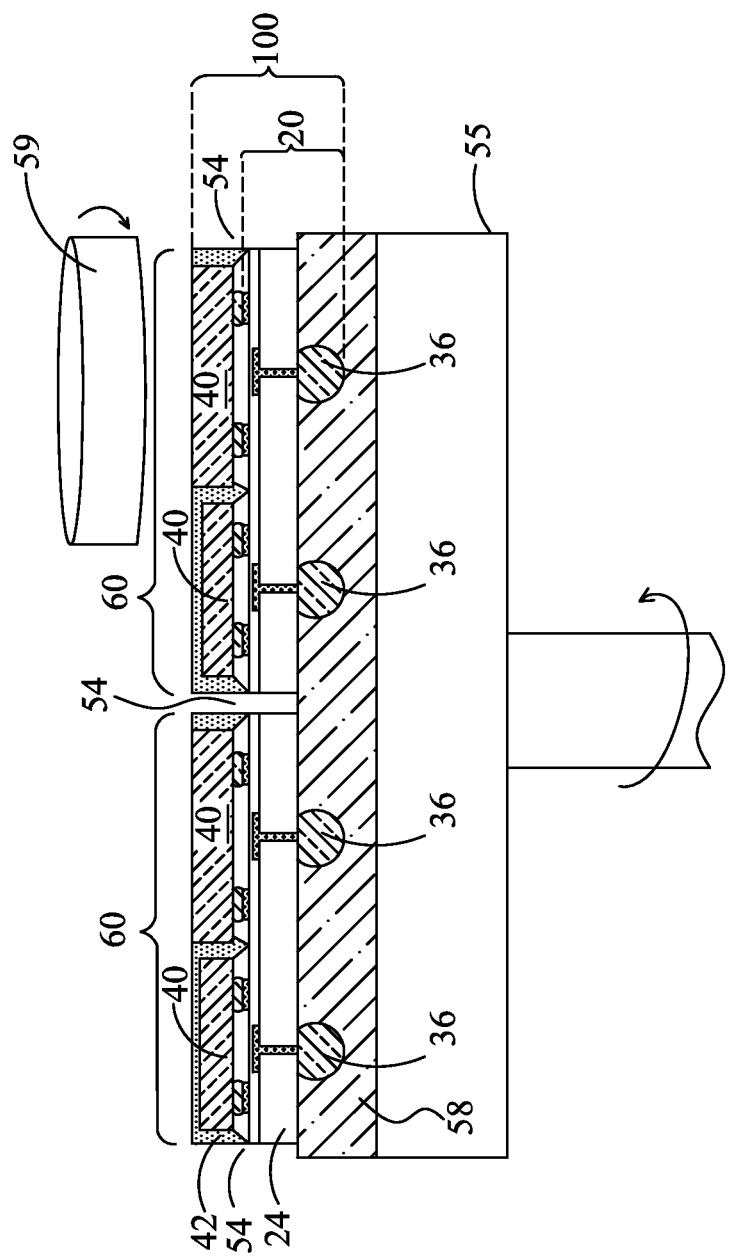

Referring to FIG. 7, tape 58 is cut to substantially the same size as composite wafer 100. The top-view shape of tape 58 may be substantially the same as the top-view shape of composite wafer 100. As a result, tape 58 and composite wafer 100 in combination may be treated as a wafer, and may be transported and processed similar to a wafer.

As also shown in FIG. 7, a grinding is performed on composite wafer 100 to remove the residue of bonding layer 48, if any. To perform the grinding step, tape 58 may be sucked by a suction head (not shown) and transported onto chuck table 55. Chuck table 55 may hold tape 58 and the overlying components in place through vacuum. The grinding may then be performed, for example, using grinding wheel 59. Since wafer 20 has been sawed apart in the step shown in FIG. 3, with only a thin layer of 42/48 interconnecting tiles 22, the stress in composite wafer 100 is released. The structure in FIG. 7 may be substantially flat, and the warpage of composite wafer 100 is significantly reduced. Accordingly, during the transportation of tape 58 and composite wafer 100, tape 58 may be securely sucked onto the suction head through vacuum. Furthermore, chuck table 55 may also hold tape 58 and the composite wafer 100 securely. The grinding is performed until the portions (if any) of polymer layer 42 that hold composite wafer 100 as one piece are removed, so that tiles 22 and the overlying package components 40 are fully separated into dies 60.

Figure 8:
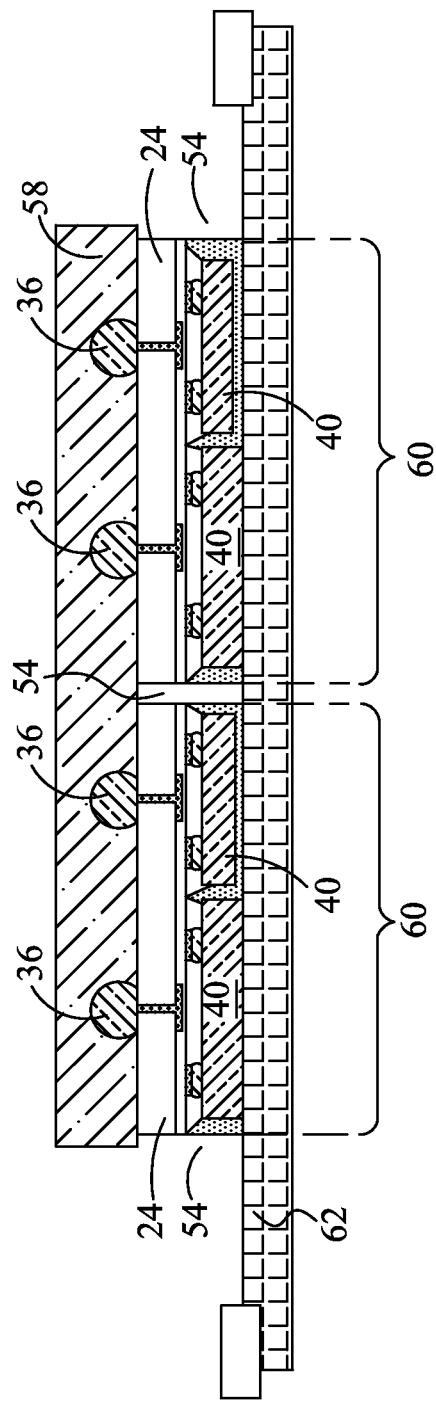
Figure 9:
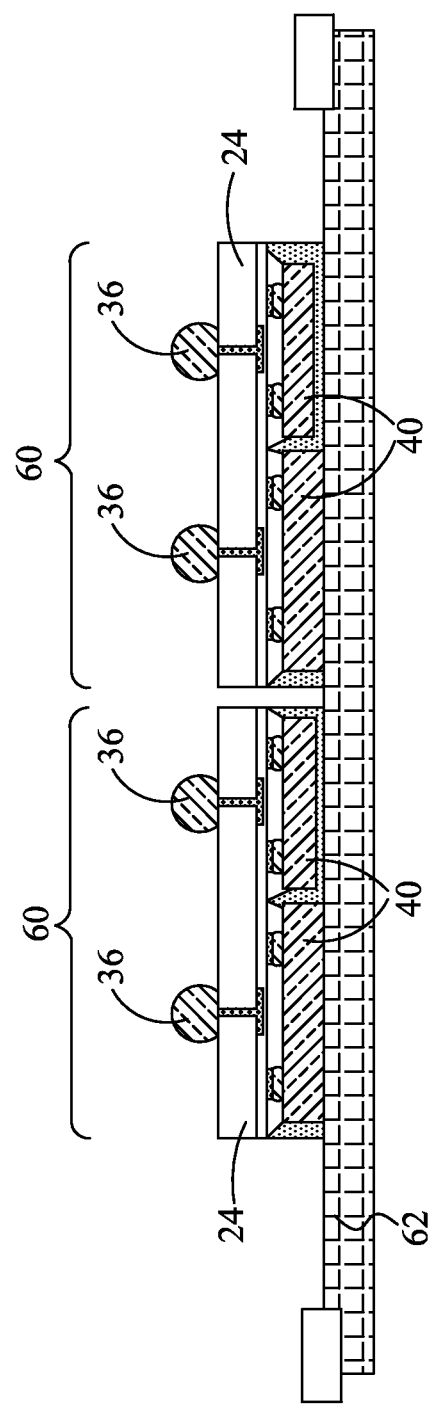

Referring to FIG. 8, tape 58 and dies 60 are mounted on dicing tape 62, with dies 60 adhered to dicing tape 62. Tape 58 is then removed from dies 60. In the embodiments wherein tape 58 is a UV tape, a UV light may be projected onto tape 58, so that tape 58 is no longer adhesive, and hence can be removed. In the resulting structure in FIG. 9, dies 60 are separated from each other, and are adhered to dicing tape 62. Dies 60 may then be sent along with dicing tape 62 for further packaging.

In conventional processes, after the de-bonding of carriers, thin wafers may have warpage, which adversely causes the thin wafers unable to be secured on chuck tables, and the wafers cannot be transported automatically since it cannot be sucked using vacuum. In the embodiments, by adopting the dicing-before-de-bonding scheme, in which a wafer is diced before the wafer is de-bonded from the respective carrier, the warpage of the wafer is significantly reduced. Accordingly, the subsequent processes may be performed automatically without the concern the warpage of the wafers.

In accordance with embodiments, a method includes performing a dicing on a composite wafer including a plurality of dies, wherein the composite wafer is bonded on a carrier when the step of dicing is performed. After the step of dicing, the composite wafer is mounted onto a tape. The carrier is then de-bonded from the composite wafer and the first tape.

In accordance with other embodiments, a method includes performing a dicing on a composite wafer comprising a wafer and package components bonded to the wafer, so that trenches are formed in the composite wafer. The trenches penetrate through the wafer and extend into a polymer that fills gaps between the package components. During the step of dicing, the composite wafer is bonded on a carrier. The method further includes mounting the composite wafer onto a first tape; de-bonding the carrier from the composite wafer and the first tape, and grinding the composite wafer to separate the composite wafer into a plurality of dies that are fully separated from each other. After the step of grinding, a second tape is mounted to the plurality of dies. After the step of mounting the second tape, the first tape is demounted.

In accordance with yet other embodiments, a method includes forming connectors on a first side of a composite wafer, wherein a carrier is bonded to a second side of the composite wafer, and wherein the first and the second sides are opposite sides of the composite wafer. The composite wafer is sawed from the first side to form trenches, wherein the trenches penetrate through a wafer in the composite wafer and extend into a molding compound in the composite wafer. The composite wafer is mounted onto a first tape, wherein the connectors are in contact with the first tape. The carrier is de-bonded from the composite wafer and the first tape. After the step of be-bonding, the composite wafer is separated into individual dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   mounting a carrier and a composite wafer onto a first tape, with the carrier located between the composite wafer and the first tape;
   after the mounting the carrier and the composite wafer onto the first tape, performing a dicing on the composite wafer comprising a plurality of dies, wherein the carrier remains attached to the first tape and the composite wafer during the step of dicing;
   de-taping the first tape from the composite wafer and the carrier;
   after the step of dicing and the de-taping, mounting the composite wafer onto a second tape; and
   de-bonding the carrier from the composite wafer and the second tape.

2. The method of claim 1, wherein the composite wafer comprises a wafer, wherein each of the plurality of dies comprises a tile of the wafer and one of a plurality of package components bonded to the wafer, and wherein after the step of dicing, tiles of the wafer are separated from each other.

3. The method of claim 2, wherein the composite wafer further comprises a polymer molded onto the wafer, with the polymer disposed in gaps between the plurality of package components, and wherein after the step of dicing, the plurality of dies are connected to each other through un-diced portions of the polymer.

4. The method of claim 1 further comprising:
after the step of de-bonding the carrier, cutting the second tape to substantially a same size as the composite wafer; and
performing a grinding on the composite wafer to separate the plurality of dies from each other, wherein during the step of grinding, the second tape that has been cut remains mounted on the composite wafer.

5. The method of claim 4 further comprising:
after the step of grinding, mounting a third tape onto the plurality of dies, wherein the second tape and the third tape are on opposite sides of the plurality of dies; and
demounting the second tape from the composite wafer.

6. The method of claim 1, wherein the carrier comprises a glass carrier.

7. A method comprising:
performing a dicing on a composite wafer comprising a wafer and package components bonded to the wafer to form trenches in the composite wafer, wherein the trenches penetrate through the wafer and extend into a polymer that fills gaps between the package components, and wherein during the step of dicing, the composite wafer is bonded on a carrier;
mounting the composite wafer onto a first tape;
de-bonding the carrier from the composite wafer and the first tape;
grinding the composite wafer to separate the composite wafer into a plurality of dies that are fully separated from each other;
after the step of grinding, mounting a second tape to the plurality of dies; and
after the step of mounting the second tape, demounting the first tape.

8. The method of claim 7, wherein after the step of dicing and before the step of grinding, the plurality of dies is connected to each other through an un-diced layer of the polymer, and wherein the un-diced layer of the polymer is removed by the step of grinding.

9. The method of claim 7, wherein after the step of dicing and before the step of grinding, an adhesive layer bonds the carrier to the composite wafer, and wherein the adhesive layer is not sawed during the step of dicing.

10. The method of claim 7, wherein the wafer is an interposer wafer comprising no active devices therein, and wherein the package components comprise device dies.

11. The method of claim 7 further comprising:
before the step of dicing, mounting the carrier onto a third tape, wherein the carrier is located between the composite wafer and the third tape, and wherein the carrier remains attached on the third tape during the step of dicing; and
before the step of mounting the first tape, de-taping the third tape from the composite wafer and the carrier.

12. The method of claim 7, wherein the carrier comprise a glass carrier.

13. A method comprising:
forming connectors on a first side of a composite wafer, wherein a carrier is bonded to a second side of the composite wafer, and wherein the first and the second sides are opposite sides of the composite wafer;
sawing the composite wafer from the first side to form trenches, wherein the trenches penetrate through a wafer in the composite wafer and extend into a molding compound in the composite wafer;
mounting the composite wafer onto a first tape, wherein the connectors are in contact with the first tape;
de-bonding the carrier from the composite wafer and the first tape; and
after the step of be-bonding, separating the composite wafer into individual dies, wherein the step of separating the composite wafer comprises performing a grinding to remove a layer selected from the group consisting essentially of a layer of the molding compound that interconnects the individual dies, a bonding layer that bonds the carrier to the composite wafer, and combinations thereof.

14. The method of claim 13, wherein after the step of sawing, the trenches penetrate through the molding compound.

15. The method of claim 13, wherein after the step of sawing, the trenches do not entirely penetrate through the molding compound.

16. The method of claim 13, wherein the step of separating the composite wafer into the individual dies comprises performing a grinding on the composite wafer from the second side of the composite wafer, wherein portions of the molding compound that interconnect the individual dies are removed due to the step of grinding.

17. The method of claim 13, wherein the wafer is an interposer wafer comprising no active devices therein, and wherein the composite wafer further comprises device dies bonded to the interposer wafer, with the molding compound disposed in gaps between the device dies.

18. The method of claim 13 further comprising, after the step of de-bonding the carrier from the composite wafer and the first tape and before the step of separating the composite wafer into individual dies, cutting the first tape to a shape close to a shape of the composite wafer.

19. The method of claim 18, wherein the step of separating the composite wafer into individual dies comprises grinding, and wherein during the grinding, the first tape is attached to the composite wafer.

* * * * *

UNITED STATES PATENT AND TRADEMARK OFFICE
CERTIFICATE OF CORRECTION

PATENT NO.         : 8,629,043 B2                                    Page 1 of 1
APPLICATION NO.    : 13/298014
DATED              : January 14, 2014
INVENTOR(S)        : Chung Yu Wang et al.

It is certified that error appears in the above-identified patent and that said Letters Patent is hereby corrected as shown below:

In the Claims:

In Col. 6, line 19, claim 13, delete "be-bonding" and insert --de-bonding--.

Signed and Sealed this
Twenty-fifth Day of March, 2014

Michelle K. Lee
*Deputy Director of the United States Patent and Trademark Office*